United States Patent [19]

Kuriyama

[11] Patent Number: 5,502,614
[45] Date of Patent: Mar. 26, 1996

[54] SOLID ELECTROLYTIC CAPACITOR

[75] Inventor: Chojiro Kuriyama, Kyoto, Japan

[73] Assignee: Rohm Co., Ltd., Kyoto, Japan

[21] Appl. No.: 335,593

[22] Filed: Nov. 8, 1994

Related U.S. Application Data

[60] Continuation of Ser. No. 164,802, Dec. 10, 1993, abandoned, which is a division of Ser. No. 41,972, Apr. 2, 1993, Pat. No. 5,329,421.

[30] Foreign Application Priority Data

Apr. 7, 1992 [JP] Japan ..................................... 4-85354

[51] Int. Cl.⁶ .................................................. H01G 9/15
[52] U.S. Cl. .......................... 361/534; 361/538; 361/540
[58] Field of Search .............................. 361/274.1, 275.1, 361/275.4, 528, 529, 534, 539, 540, 532, 533, 538, 520

[56] References Cited

U.S. PATENT DOCUMENTS

| | | | |
|---|---|---|---|
| 4,193,106 | 3/1980 | Coleman | 361/275.4 |
| 4,363,078 | 12/1982 | Dwyer | 361/520 |
| 4,510,554 | 4/1985 | Irikura | 361/540 |
| 4,935,848 | 6/1990 | Yamane et al. | 361/534 |
| 4,989,119 | 1/1991 | Gouvernelle | 361/534 |
| 5,050,043 | 9/1991 | Schnabel | 361/534 |
| 5,315,474 | 5/1994 | Kuriyama | 361/534 |

FOREIGN PATENT DOCUMENTS

| | | | |
|---|---|---|---|
| 306809 | 3/1989 | European Pat. Off. | |
| 3012950 | 10/1980 | Germany | |
| 57-46615 | 10/1982 | Japan | |
| 59-141648 | 9/1984 | Japan | |
| 3-265418 | 11/1988 | Japan | 361/534 |
| 63-299318 | 12/1988 | Japan | 361/534 |
| 3-299319 | 12/1988 | Japan | 361/534 |
| 2-294011 | 12/1990 | Japan | 361/538 |
| 2-104444 | 1/1992 | Japan | |

OTHER PUBLICATIONS

Japanese publication entitled "Solid Tantalum Capacitor for Product Safety", (NEC), vol. 44 No. Oct. 1991, pp. 116–120.

Primary Examiner—Teresa J. Walberg
Assistant Examiner—Gregory L. Mills
Attorney, Agent, or Firm—William H. Eilberg

[57] ABSTRACT

A solid electrolytic capacitor comprises a capacitor element including a chip body and an anode wire projecting from the chip body, an anode lead electrically connected to the anode wire, a cathode lead paired with the anode lead, a first fuse wire connecting electrically between the chip body and the cathode lead, and a resin package enclosing the capacitor element, part of the anode lead, part of the cathode lead, and the first fuse wire. The capacitor further comprises an auxiliary lead separate from the anode and cathode leads, and a second fuse wire for electrically connecting the auxiliary lead to one of the chip body and the anode lead within the resin package. In an alternative embodiment, there is only a single fuse wire, the fuse wire acting both as a temperature fuse and as an overcurrent fuse.

2 Claims, 6 Drawing Sheets

SOLID ELECTROLYTIC CAPACITOR

This application is a continuation of application Ser. No. 08/164,802, filed on Dec. 10, 1993, now abandoned, which is a divisional application of application Ser. No. 08/041,972, filed on Apr. 2, 1993, now U.S. Pat. No. 5,329,421.

BACKGROUND OF THE INVENTION

1. Field of the Invention

This invention relates to solid electrolytic capacitors such as solid tantalum or aluminum capacitors. More specifically, the present invention relates to a solid electrolytic capacitor of the type which has two different built-in fuses for improving the safety of the capacitor.

2. Description of the Prior Art

It is generally known that a solid electrolytic capacitor such as tantalum capacitor provides a large capacitance while enabling a size reduction. On the other hand, the solid electrolytic capacitor is also known to generate a great amount of heat when the capacitor element has a certain defect or when the capacitor is erroneously incorporated in a circuit with reverse polarity.

In view of the above problem, it has been proposed to incorporate a temperature fuse wire in a solid electrolytic capacitor, as disclosed for example in "NEC Technical Report" Vol. 44, No. 10/1991, Pages 116–120. The temperature fuse, which may be typically made of a low melting point solder, is designed to thermally break when the temperature rises to an abnormal level of above 300° C. for example.

Further, in an electric circuit incorporating a solid electrolytic capacitor, it is required to prevent various semiconductor components of the circuit from being damaged by an overcurrent which may be caused by a shorting for example. For this purpose, use may be made of an overcurrent fuse as an independent component, as disclosed in Japanese Utility Model Application Laid-open No. 59-141648 or Japanese Utility Model Publication No. 57-46615. Typically, the overcurrent fuse comprises a thin fuse wire made of a high melting point metal such as gold, copper or aluminum, and arranged between a pair of leads, the fuse wire being enclosed in a resin package.

However, since the prior art overcurrent fuse, which is an independent component, need be arranged separately, there is a limitation in increasing the packaging or mounting density (which is the number of electronic components per unit area) of a printed circuit board which incorporates the overcurrent fuse in addition to a solid electrolytic capacitor. Thus, a difficulty arises in reducing the size and weight of the printed circuit board. Further, the separate nature of the prior art overcurrent fuse necessitates separate mounting thereof by soldering, thereby increasing the production cost of the circuit board.

SUMMARY OF THE INVENTION

It is, therefore, an object of the present invention to provide a solid electrolytic capacitor, particularly a tantulum capacitor, which has a dual function of preventing an overheat and an overcurrent.

Another object of the invention is to provide a solid electrolytic capacitor which can be reliably prevented from being mounted in reverse polarity.

According to one aspect of the present invention, there is provided a solid electrolytic capacitor comprising: a capacitor element including a chip body and an anode wire projecting from the chip body; an anode lead electrically connected to the anode wire; a cathode lead paired with the anode lead; a first fuse wire connecting electrically between the chip body and the cathode lead; and a resin package enclosing the capacitor element, part of the anode lead, part of the cathode lead, and the first fuse wire; wherein the capacitor further comprises: an auxiliary lead separate from the anode and cathode leads; and a second fuse wire for electrically connecting the auxiliary lead to one of the chip body and the anode lead within the resin package.

The first fuse wire may be a temperature fuse wire, whereas the second fuse wire may be an overcurrent fuse wire. Alternatively, the first fuse wire may be an overcurrent fuse wire, whereas the second fuse wire may be a temperature fuse.

In one preferred embodiment, the auxiliary lead is arranged in side-by-side relation to the cathode lead. In this embodiment, the second fuse is made to connect electrically between the chip body and the auxiliary lead.

In another preferred embodiment, the auxiliary lead is arranged in side-by-side relation to the anode lead. In this case, the second fuse wire is made to connect electrically between the anode lead and the auxiliary lead.

According to another aspect of the present invention, there is provided a solid electrolytic capacitor comprising: a capacitor element including a chip body and an anode wire projecting from the chip body; an anode lead electrically connected to the anode wire; a cathode lead paired with the anode lead and electrically connected to the chip body; and a resin package enclosing the capacitor element, part of the anode lead, and part of the cathode lead; wherein the capacitor further comprises: an auxiliary lead separate from the anode and cathode leads; and a solder fuse wire for electrically connecting the auxiliary lead to said one of the anode and cathode leads within the resin package.

With such an arrangement, the solder fuse wire itself may be made to work not only as a temperature fuse but also as an overcurrent fuse. Thus, the cathode fuse may be directly connected to the chip body.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 1:
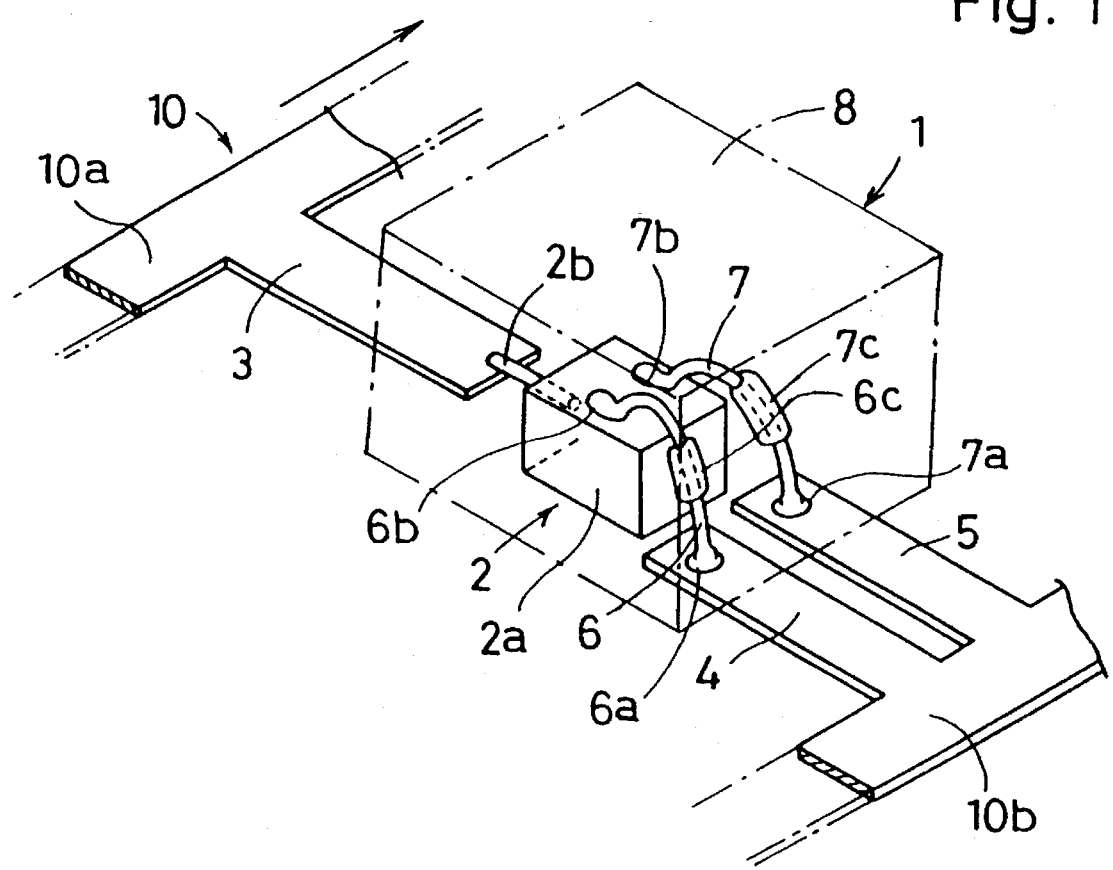
FIG. 1 is a perspective view showing a solid electrolytic capacitor according to the present invention before separation from a leadframe.
Figure 2:
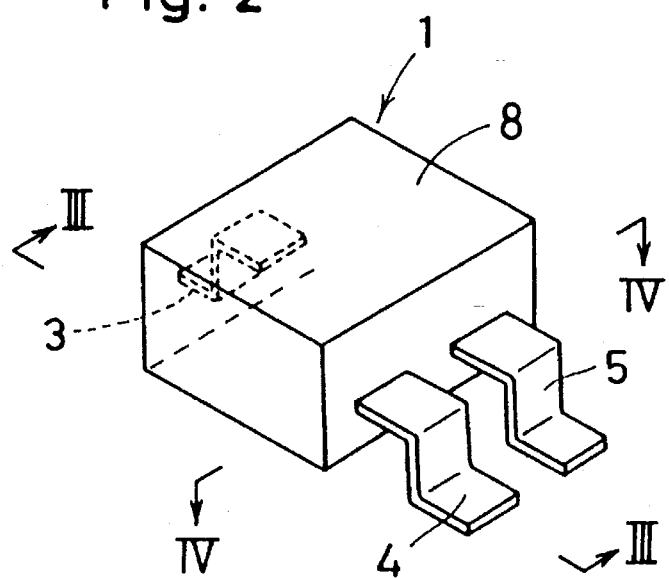
FIG. 2 is a perspective view of the same capacitor after separation from the leadframe.
Figure 3:
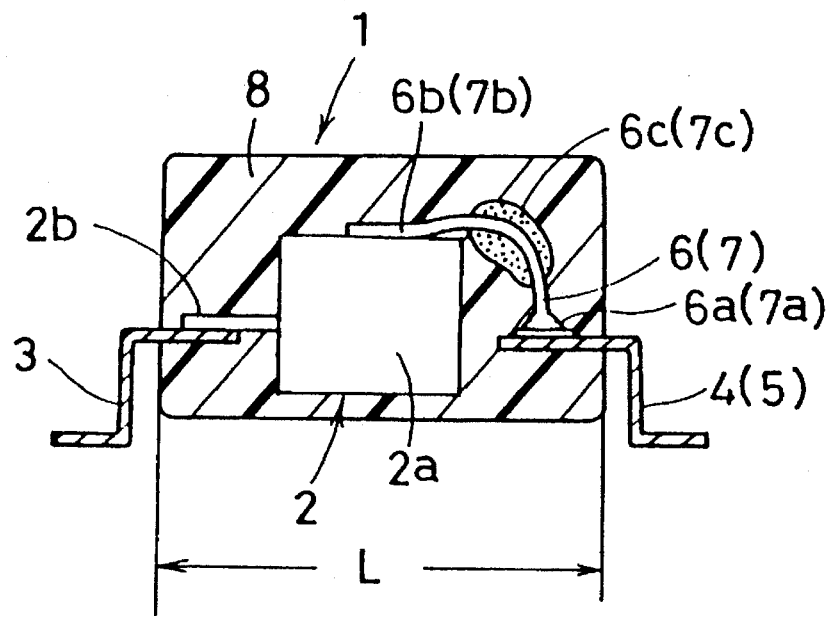
FIG. 3 is a sectional view taken along lines III—III in FIG. 2.
Figure 4:
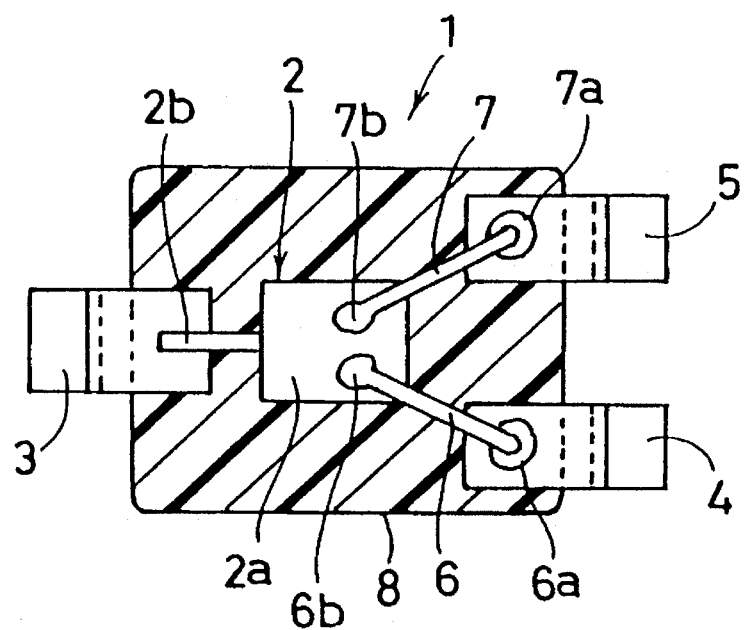
FIG. 4 is a sectional view taken along lines IV—IV in FIG. 2.

FIGS. 1 to 4 of the accompanying drawings show a solid electrolytic capacitor 1 (tantalum capacitor) according to a first embodiment of the present invention. The capacitor 1 comprises a capacitor element 2 which includes a chip body 2a (sintered mass of metal particles) and an anode wire 2b projecting from the chip body.

The capacitor 1 further comprises an anode lead 3 electrically connected to the anode wire 2b by welding for example, a cathode lead 4 electrically connected to the chip body 2a through a temperature fuse wire 6, and an auxiliary lead 5 electrically connected to the chip body 2a through an overcurrent fuse 7. According to the first embodiment, the anode lead 3 is located on one side of the chip element 2, whereas the cathode and auxiliary leads 4, 5 are arranged in parallel to each other on the other side of the chip element 2.

The temperature fuse wire 6 is partially enclosed in a relatively soft arc-extinguishing member 6c. Similarly, the overcurrent fuse wire 7 is partially enclosed in a relatively soft arc-extinguishing member 7c. The respective arc-extinguishing members 6c, 7c may be made of silicone resin.

The capacitor element 2 together with the respective fuse wires 6, 7 and part of the respective leads 3–5 is enclosed in a protective package 8 which is made of a relatively hard resin such as epoxy. The projecting portions of the respective leads 3–5 are bent in a stepped form.

In the first embodiment, the temperature fuse wire 6 is made of solder wherein the proportion of lead (Pb) and tin (Sn) is selected to have a melting point of about 300° C. This melting point is selected so that the temperature fuse wire 6 will break by melting before the resin package 8 burns (at a dangerously high temperature of above 300° C.) while preventing breakage under the heat generated at the time of soldering the capacitor 1 to a suitable portion of a printed circuit board (not shown) for die-bonding.

The diameter of the temperature fuse wire 6 may be selected in the range of about 50–120 micrometers depending on the required breaking characteristics. For example, if the fuse wire 6 has a diameter of 80 micrometers, it will break upon passage of 1–2A current for about 10 seconds because the temperature rises above 300° C. under this condition. On the other hand, if the fuse wire 6 has a diameter of 120 micrometers, it will break upon passage of 5A current for about 5 seconds.

The overcurrent fuse wire 7 may be made of a high melting point metal such as gold, silver, copper or aluminum. When using gold as the wire material, the diameter of the overcurrent fuse wire 7 may be selected in the range of about 15–30 micrometers depending on the required breaking characteristics. If the overcurrent fuse wire 7 has a diameter of 15 micrometers, it will break upon passage of 1–4A current for about 5 seconds. On the other hand, if the overcurrent fuse wire 7 has a diameter of 30 micrometers, it will break upon passage of 4–10A current for about 5 seconds.

As shown in FIG. 1, the anode lead 3 originates from a first side band 10a of a leadframe 10, whereas the cathode and auxiliary leads 4, 5 come from a second side band 10b of the same leadframe. The capacitor 1 as a final product is obtained by cutting the respective leads 3–5 off the leadframe 10 after molding the resin package 8.

In FIG. 1, only one set of leads 3–5 is shown with a corresponding capacitor element 2. In reality, however, the leadframe 10 includes a plurality of such sets of leads for quantity production.

With the arrangement described above, the solid capacitor of the first embodiment has the following advantages.

First, since the solid capacitor 1 itself incorporates not only the temperature fuse wire 6 but also the overcurrent fuse wire 7, it is unnecessary to mount an overcurrent fuse on a printed circuit board (not shown) separately from the capacitor. Thus, the packaging or mounting density of the printed circuit board can be increased, thereby enabling a reduction in the size, weight and cost of the circuit board.

Secondly, the auxiliary lead 5 is arranged in side-by-side relation to the cathode lead 4 which is located opposite to the anode lead 3. Thus, by using the presence of the auxiliary lead 5 as an indication of polarity, it is possible to prevent the capacitor from being mounted with reverse polarity.

In the first embodiment, the bonding of the temperature fuse wire 6, which is made of solder, may be preferably performed in the following manner.

Figure 5:
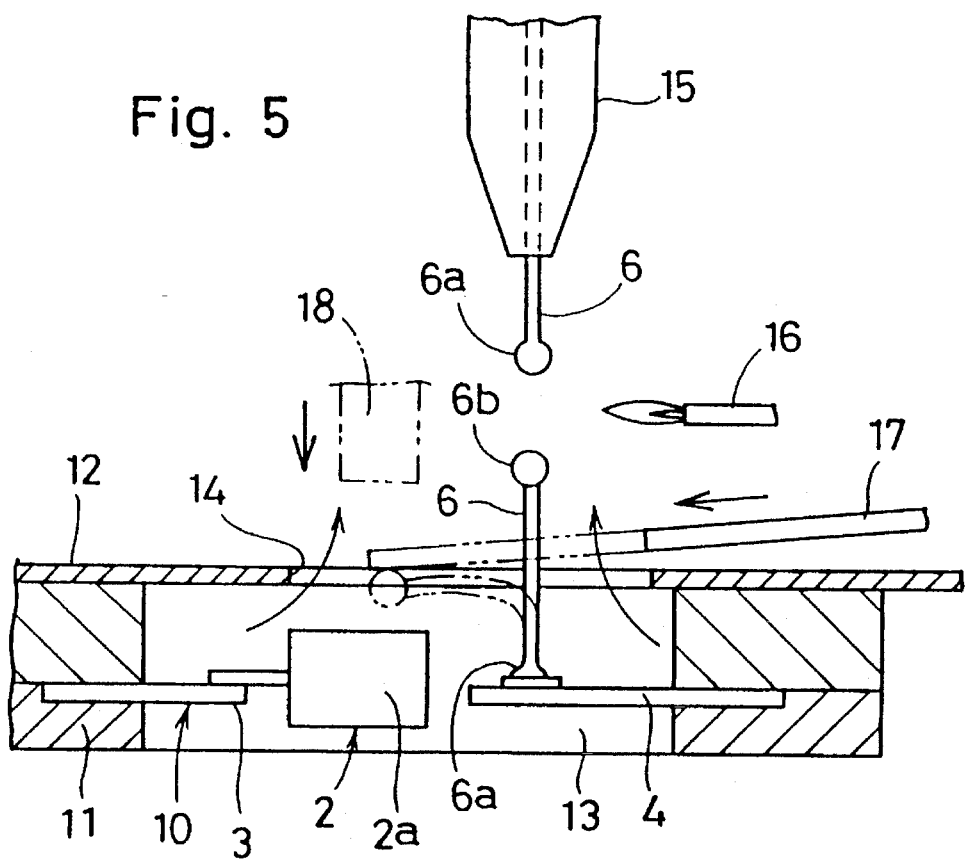
FIGS. 5 and 6 are views showing a method of performing fuse wire bonding.
Figure 6:
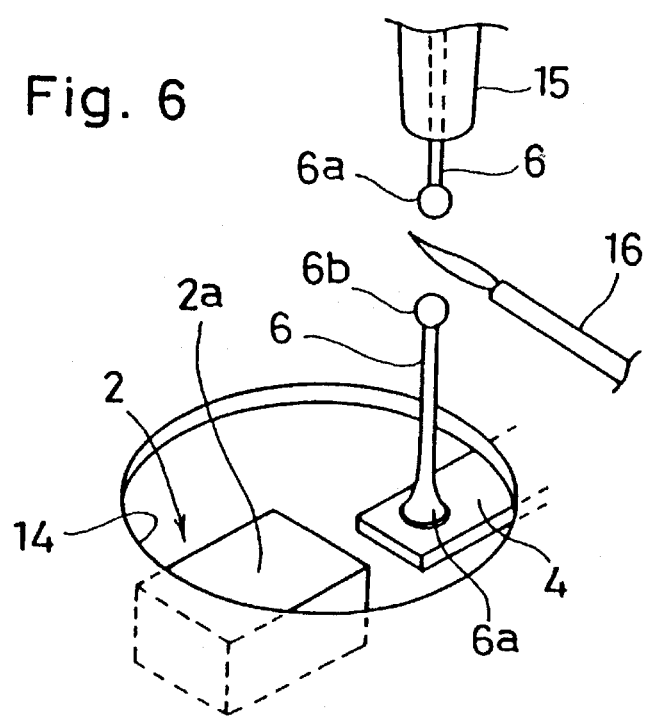

As shown in FIGS. 5 and 6, a combination of a heater block 11 and a cover plate 12 is used for bonding the temperature fuse wire 6 to the corresponding cathode lead 4 of the leadframe 10 and to the corresponding capacitor chip body 2a. The heater block 11 has a tunnel 13 in which the capacitor element 2 fixed to the leadframe 10 is arranged, whereas the cover plate 12 has an opening 14 communicating with the tunnel 13. Above the opening 14, there are arranged a capillary tool 15 for continuously supplying a solder fuse wire 6, a torch 16, a bending tool 17, and a bonding tool 18.

During the bonding operation, a reducing gas (containing nitrogen gas mixed with about 4–5% of hydrogen gas for example) or an inert gas (containing only nitrogen gas for example) is supplied to the tunnel 13 of the heater block 11 from below for discharging through the opening 14 of the cover plate 12, so that a reducing or inert atmosphere is created immediately above the opening 14.

In this condition, the lower end 6a of the fuse wire 6, which has been previously melted into a ball, is first bonded to the cathode lead 4 by lowering the capillary tool 15 for pressing the ball end 6a to the cathode lead 4 under application of heat (provided by the heater block 11) and/or ultrasonic vibration. As a result, the wire ball end 6a is deformed to have a nail head shape.

Then, the capillary tool 15 is raised while allowing the fuse wire 6 to be paid out. When the capillary tool is raised by a predetermined amount, the torch 16 is brought closer to the fuse wire 6 for thermal cutting thereof. As a result, the shorter portion of the fuse wire 6 connected to the cathode lead 4 is made to have an upper ball end 6b, whereas the other portion of the fuse wire 6 still remaining on the capillary tool 15 is made to have a new lower ball end 6a. Obviously, the new ball end 6a is used for bonding to the next cathode lead (not shown).

Then, the upper ball end 6b of the shorter fuse wire 6 is bent toward the chip body 2a of the capacitor element 2 by advancing the bending tool 17 generally horizontally, as indicated by phantom lines in FIG. 5.

Finally, the upper ball end 6b of the shorter fuse wire 6 is pressed against the chip body 2a of the capacitor element 2 under application of heat and/or ultrasonic vibration by the vertically movable bonding tool 18. As a result, the upper ball end 6b of the shorter fuse wire 6 is flattened into a generally discal form for electrically bonding to the capacitor chip body 2a (see FIGS. 3 and 4).

The above manner of fuse wire bonding is advantageous in the following points.

First, since the lower end 6a of the fuse wire 6 has a nail head form to increase the adhesion area (namely, the bonding strength) relative to the cathode lead 4 without increasing the length of that end 6a itself, it is possible to decrease the length of the cathode lead 4, thereby enabling to reduce the length L (FIG. 3) of the capacitor as a whole. Obviously, such a size reduction also contributes to a reduction in the weight and cost of the capacitor.

Secondly, due to the formation of the nail head end 6a, the fuse wire 6 has no cross-sectionally reduced portion which would be easily broken at the time of molding the resin package 8 and which would result in variations of the breaking characteristics. Thus, it is possible to increase the yield of production and equalize the breaking characteristics from product to product.

In the third place, since the fuse wire 6 is made to extend perpendicularly to the cathode lead 4 at a position adjacent to the nail head end 6a, the cathode lead 4 may be located as close to the chip body 2a as possible. Such an arrangement also contributes to a reduction of the length L of the capacitor 1.

In the fourth place, the discal end 6b of the fuse wire 6 for bonding to the capacitor chip body 2a is formed by flattening the upper ball end of the wire. Obviously, the discal wire end 6b provides an increased adhesion area as required for insuring a sufficient bonding strength. In addition, it is unnecessary to separately use solder or conductive paste for electrical connection, thereby facilitating the bonding operation and reducing the production cost.

In the fifth place, despite flattening for increasing the adhesion area, the thickness T (see FIG. 8) of the discal fuse wire end 6b can be rendered generally equal to the diameter D of the fuse wire 6 due to the utilization of the ball end. Thus, near the discal end 6b, the fuse wire 6 will have no cross-sectionally reduced portion which would be easily broken at the time of molding the resin package 8 (FIGS. 1–4) and which would result in variations of the breaking characteristics.

Figure 7:
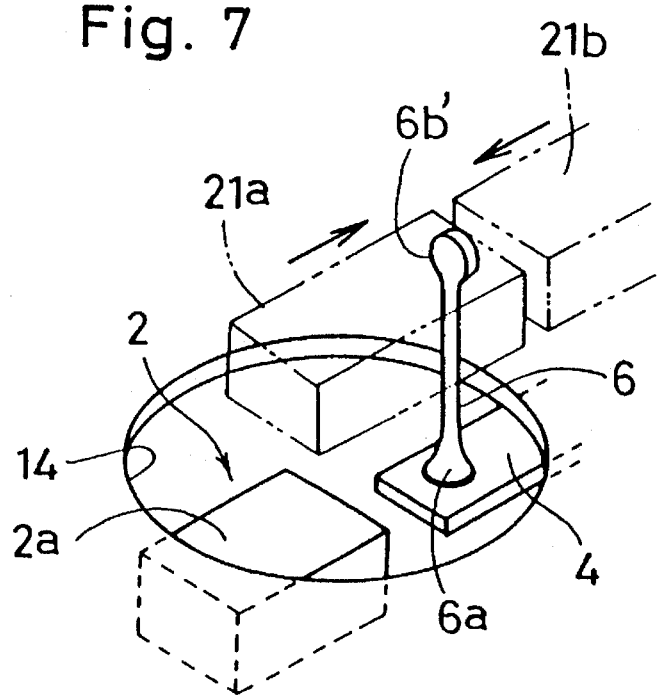
FIGS. 7 and 8 are views showing another method of performing fuse wire bonding.

Instead of immediately pressing against the cathode lead 4, the upper ball end 6b of the fuse wire 6 may be first flattened into a discal form by compressing between a pair of clamp members 21a, 21b, as shown in FIG. 7. Thereafter, the flattened discal end 6b is brought toward the capacitor chip body 2a by advancing the bending tool 17 (FIG. 5), and pressed against the chip body 2a for bonding thereto by lowering the bonding tool 18 (also FIG. 5), as shown in FIG. 8.

Figure 8:
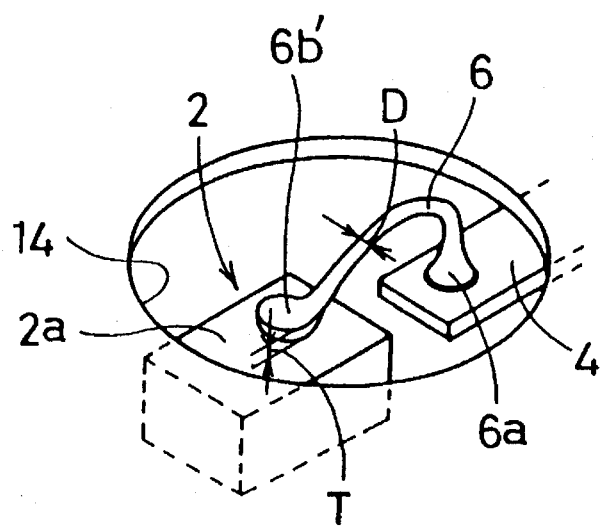

According to the bonding method illustrated in FIGS. 7 and 8, the upper ball end 6b of the fuse wire 6 is flattened before bonding to the capacitor chip body 2a. Thus, the subsequent bonding of the thus flattened discal end 6b of the fuse wire 6 relative to the capacitor chip body 2a can be performed with a smaller bonding force than required for flattening the wire ball end simultaneously with bonding to the chip body. As a result, the chip body 2a, which is a sintered mass of metal particles, is less likely to be damaged (e.g. material chipping or crack formation) at the time of bonding the fuse wire 6.

Obviously, the overcurrent fuse wire 7, which may be made of gold, silver, copper or aluminum, may be bonded to the auxiliary lead 5 and the chip body 2a in the same manner as shown in FIGS. 5 to 8 for the temperature fuse wire 6. As a result, the overcurrent fuse wire 7 is made to have a nail head end 7a for bonding to the auxiliary lead 5, and a flattened discal end 7b for bonding to the chip body 2a. Thus, the same advantages as described above for the temperature wire 6 also hold true with respect to the overcurrent fuse wire 7.

Figure 9:
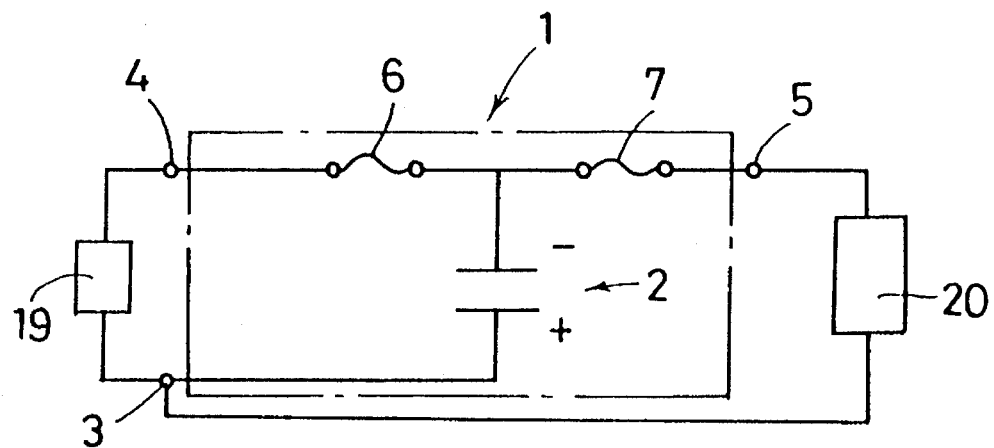
FIG. 9 is a view showing a circuit which incorporates the capacitor illustrated in FIGS. 1 to 4.

FIG. 9 illustrates a circuit which incorporates the solid capacitor 1 of the first embodiment. The circuit includes a power source 19 and a load 20. The power source 19 is arranged between the anode lead 3 and the cathode lead 4, whereas the load 20 is disposed between the anode lead 3 and the auxiliary lead 5. Thus, the temperature fuse wire 6 is associated with the power source 19 while the overcurrent fuse 7 is associated with the load 20.

With the circuit arrangement shown in FIG. 9, when the temperature of the capacitor 1 exceeds a predetermined value (e.g. 300° C.), the temperature fuse 6 breaks thermally to separate the capacitor element 2 from the power source 19. On the other hand, when an overcurrent passes through the overcurrent fuse wire 7 of the capacitor due to a shorting on the side of the load 20, the overcurrent fuse wire 7 breaks to separate the load 20 from the power source 19, thereby protecting semiconductor components (not shown) included on the side of the load 20.

Figure 10:
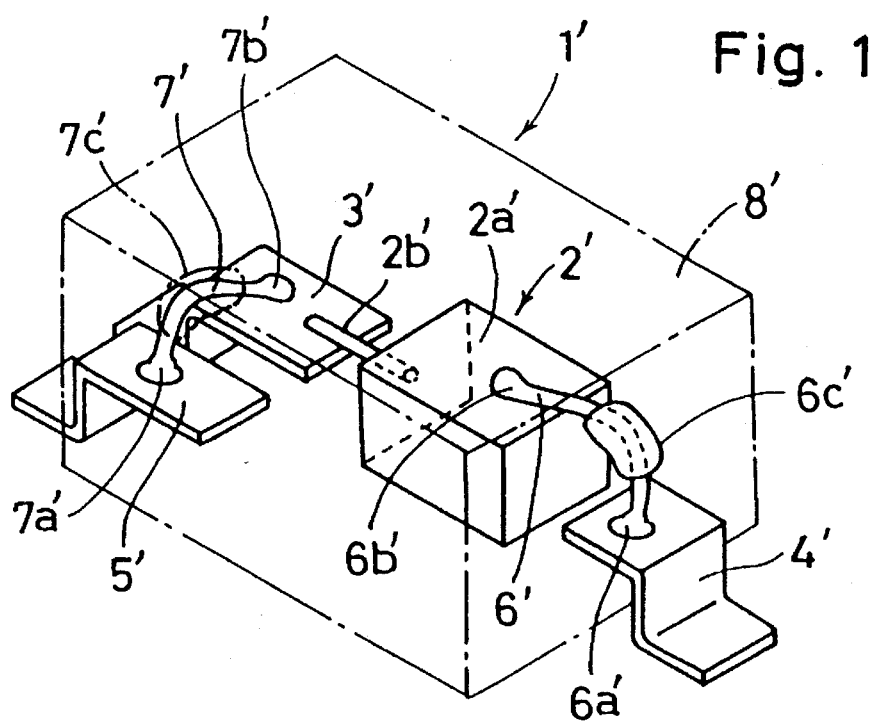
FIG. 10 is a perspective view showing another solid electrolytic capacitor according to the present invention.

FIG. 10 shows a solid electrolytic capacitor 1' (tantalum capacitor) according to a second embodiment of the present invention. The capacitor 1' of this embodiment comprises a capacitor element 2' which includes a chip body 2a' (sintered mass of metal particles) and an anode wire 2b' projecting from the chip body.

The capacitor 1' further comprises an anode lead 3' electrically connected to the anode wire 2b' by welding for example, a cathode lead 4' electrically connected to the chip body 2a' through a temperature fuse wire 6', and an auxiliary lead 5' electrically connected to the anode lead 3' through an overcurrent fuse 7'. Thus, according to the second embodiment, the anode lead 3' and the auxiliary lead 5' are located on a same side of the chip element 2', whereas the cathode lead 4' alone is arranged on the opposite side of the chip element 2'.

The temperature fuse wire 6' has a nail head end 6a' for bonding to the cathode lead 4', and a flattened discal end 6b' for bonding to the chip body 2a'. Similarly, the overcurrent fuse wire 7' has a nail head end 7a' for bonding to the auxiliary lead 5', and a flattened discal end 7b' for bonding to the anode lead 3'.

The temperature fuse wire 6' is partially enclosed in a relatively soft arc-extinguishing member 6c'. Similarly, the overcurrent fuse wire 7' is partially enclosed in a relatively soft arc-extinguishing member 7c'.

The capacitor element 2' together with the respective fuse wires 6', 7' and part of the respective leads 3'–5' is enclosed in a protective package 8' which is made of a relatively hard resin such as epoxy. The projecting portions of the respective leads 3'–5' are bent in a stepped form.

According to the second embodiment, both of the temperature fuse wire 6' and the overcurrent fuse wire 7' are incorporated in the same capacitor 1'. Further, the presence of the auxiliary lead 5' indicates the polarity of the capacitor 1'. Thus, the capacitor of this embodiment has the same advantages as that of the first embodiment.

Figure 11:
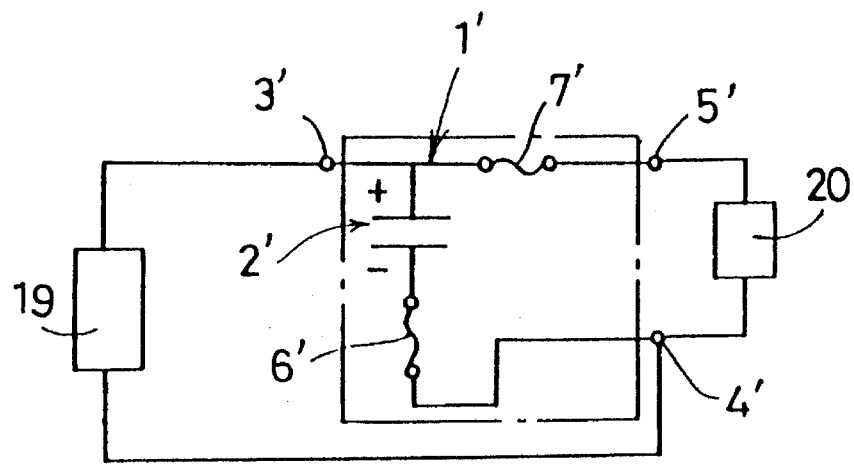
FIG. 11 is a view showing another circuit which incorporates the capacitor illustrated in FIG. 10.

FIG. 11 illustrates a circuit which incorporates the solid capacitor 1' of the second embodiment. The circuit includes a power source 19 and a load 20. The power source 19 is arranged between the anode lead 3' and the cathode lead 4', whereas the load 20 is disposed between the cathode lead 4' and the auxiliary lead 5'.

With the circuit arrangement shown in FIG. 11, when the temperature of the capacitor 1' exceeds a predetermined value (e.g. 300° C.), the temperature fuse 6' breaks by melting to separate the capacitor element 2' from the power source 19. On the other hand, when an overcurrent passes through the overcurrent fuse wire 7' of the capacitor due to a shorting on the side of the load 20, the overcurrent fuse wire 7' breaks to separate the load 20 from the power source 19.

Figure 12:
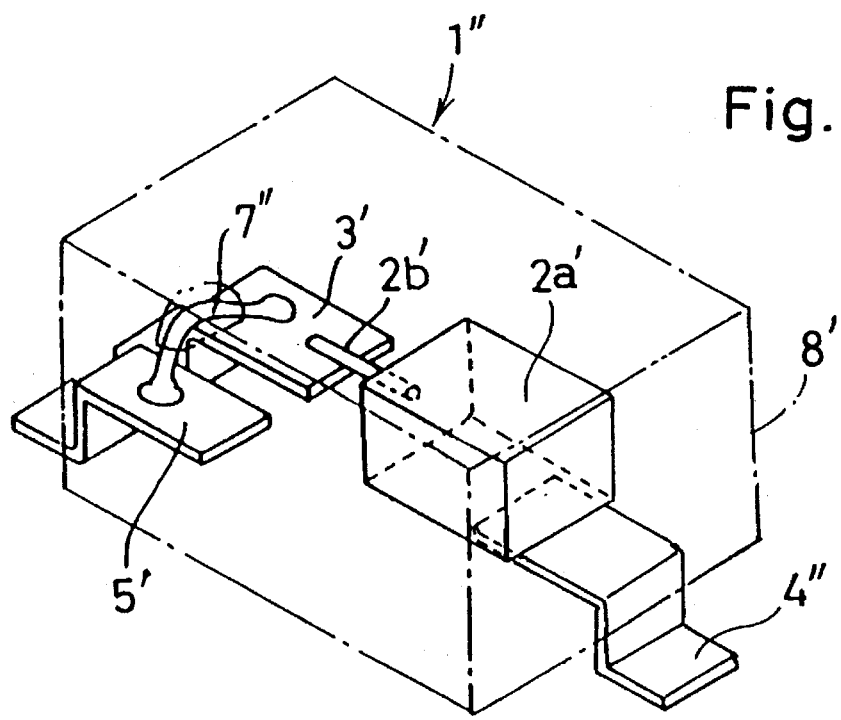
FIG. 12 is a perspective view showing a further solid electrolytic capacitor according to the present invention.

FIG. 12 shows a solid electrolytic capacitor 1" according to a third embodiment of the present invention. The capacitor of this embodiment is similar to that of the second embodiment but differs therefrom only in the following points.

First, a cathode lead 4" is electrically connected directly to the chip body 2a'. Thus, no separate temperature fuse is provided according to the third embodiment.

Secondly, an overcurrent fuse wire 7" connecting between the anode lead 3' and the auxiliary lead 5' is made to have an additional function as a temperature fuse. For this purpose, the fuse wire 7" is made of solder wherein the proportion of lead (Pb) and tin (Sn) is suitably selected for two different functions.

Due to the absence of a separate temperature fuse (or a separate overcurrent fuse), obviously, the third embodiment is advantageous in enabling a further reduction in the size, weight and cost of the capacitor.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

I claim:

1. A solid electrolytic capacitor comprising:

a capacitor element including a chip body and an anode wire projecting from the chip body;

an anode lead electrically connected to the anode wire;

a cathode lead paired with the anode lead and electrically connected to the chip body;

an auxiliary lead separate from the anode and cathode leads;

a resin package enclosing the capacitor element, part of the anode lead, part of the cathode lead, and part of the auxiliary lead; and a solder fuse wire for electrically connecting the auxiliary lead to one of the chip body and the anode lead within the resin package;

wherein each of the anode, cathode and auxiliary leads has an inner end located in the resin package, and an outer end projecting from the resin package; and wherein one end of the solder fuse wire is in the form of a nail head.

2. The capacitor according to claim 1, wherein the other end of the solder fuse wire is in the form of a flattened disk.

* * * * *